United States Patent
Querre

(10) Patent No.: US 7,701,378 B2
(45) Date of Patent: Apr. 20, 2010

(54) METHOD OF VALIDATING A NUMBER IN AN ELECTRONIC DEVICE AND ASSOCIATED ELECTRONIC DEVICE

(75) Inventor: Goulven Querre, Noyal sur Vilaine (FR)

(73) Assignee: Thomson Licensing, Issy les Moulineaux (FR)

( * ) Notice: Subject to any disclaimer, the term of this patent is extended or adjusted under 35 U.S.C. 154(b) by 798 days.

(21) Appl. No.: 11/629,271

(22) PCT Filed: Jun. 21, 2005

(86) PCT No.: PCT/EP2005/052867

§ 371 (c)(1),
(2), (4) Date: Dec. 12, 2006

(87) PCT Pub. No.: WO2005/125009

PCT Pub. Date: Dec. 29, 2005

(65) Prior Publication Data

US 2007/0233770 A1    Oct. 4, 2007

(30) Foreign Application Priority Data

Jun. 21, 2004   (FR)   ................................ 04 06711

(51) Int. Cl.
*H04L 17/02* (2006.01)
(52) U.S. Cl. ............... 341/173; 455/151.1; 455/151.2; 455/158.3; 348/162; 348/164; 348/734; 348/731
(58) Field of Classification Search ................ 341/176; 455/158.3, 151.1, 151.2; 348/162, 164, 734, 348/731, 725, 726
See application file for complete search history.

(56) References Cited

U.S. PATENT DOCUMENTS

| 4,279,035 | A | * | 7/1981 | Skerlos | ................... 455/158.3 |
| 5,020,139 | A |   | 5/1991 | Keenan | |
| 5,483,685 | A |   | 1/1996 | Okamura | |
| 6,084,645 | A | * | 7/2000 | Park et al. | ................... 348/734 |

FOREIGN PATENT DOCUMENTS

| DE | 3404976 | 8/1985 |
| EP | 0352446 | 1/1990 |
| WO | WO 00/79788 | 12/2000 |

OTHER PUBLICATIONS

Search Report Dated Nov. 25, 2005.

* cited by examiner

*Primary Examiner*—Albert K Wong
(74) *Attorney, Agent, or Firm*—Robert D. Shedd; Jeffrey M. Navon

(57) ABSTRACT

The present invention relates to a method of validating a number comprising a plurality of digits, the number having a maximum value, each digit being successively entered by a user during several stages. The method includes a test stage activated when the number of digits entered is equal to that of the maximum value minus a unit. This test consists in comparing the most significant digit entered with the most significant digit of the maximum value. The test validates the set of digits entered when the most significant digit entered is greater than the most significant digit of the maximum value. The invention also relates to a device capable of implementing the method.

11 Claims, 3 Drawing Sheets

Figure 1:
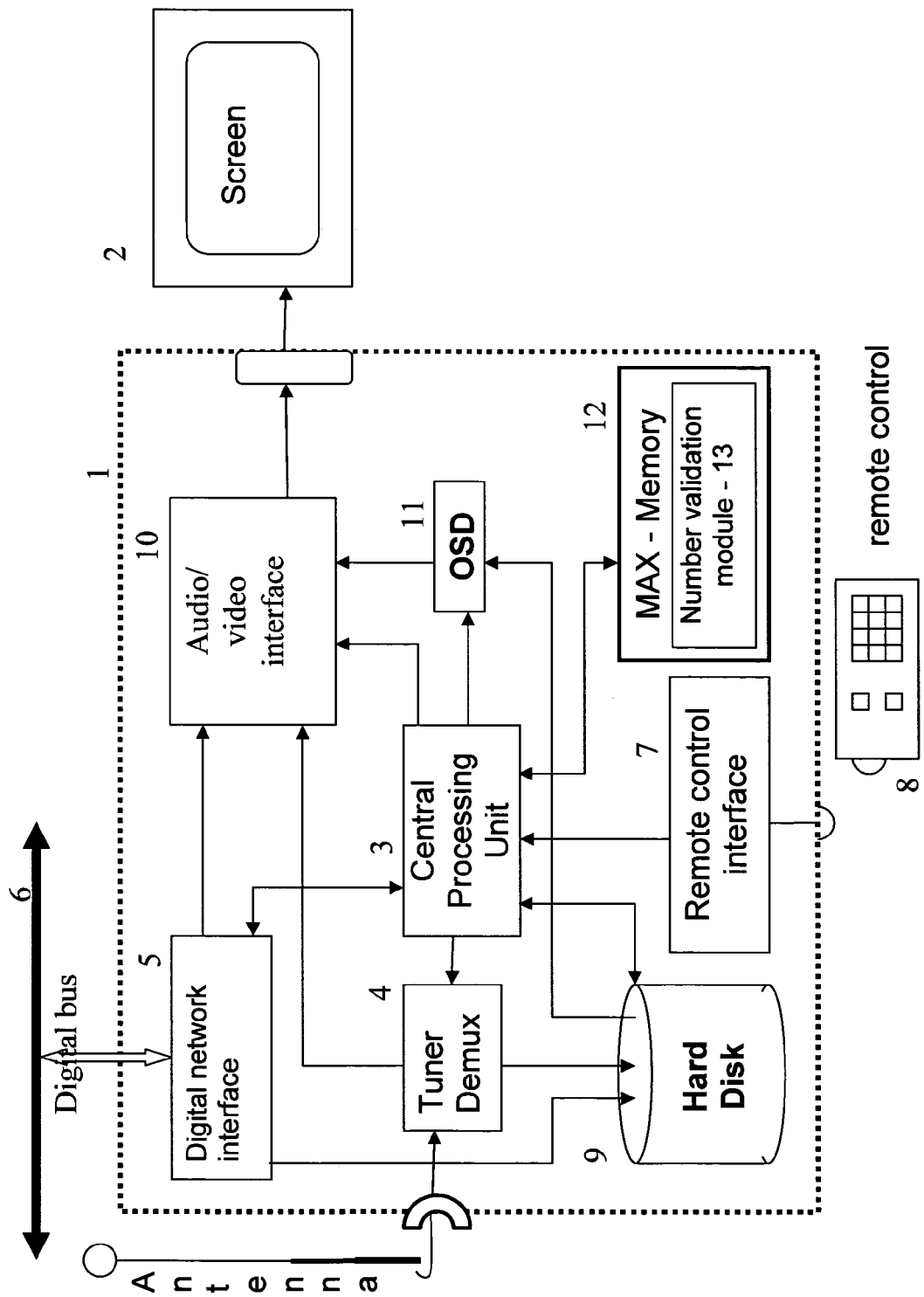

METHOD OF VALIDATING A NUMBER IN AN ELECTRONIC DEVICE AND ASSOCIATED ELECTRONIC DEVICE

This application claims the benefit, under 35 U.S.C. §365 of International Application PCT/EP2005/052867, filed Jun. 21, 2005, which was published in accordance with PCT Article 21 (2) on Dec. 29, 2005 in French and which claims the benefit of French patent application No. 0406711, filed Jun. 21, 2004.

The present invention relates to a method of validating a numerical value in an electronic device. The invention also relates to an electronic device for implementing the method.

The controls, especially remote controls, for television receiver, decoder, video cassette recorder, disk player or recorder, or other electronic devices generally include a numeric keypad having at least 10 keys numbered from "0" to "9". In the case of remote controls, these enable coded signals to be sent, most often transmitted via infrared carrier, to the receiver to be controlled. In what follows, in order to simplify the disclosure, we will refer only to a television receiver controlled by a remote control device. However, the invention applies more generally to any kind of devices capable of receiving a numerical value via a control device, such as a decoder, a video cassette recorder, a disk player and/or recorder, etc.

An example of using a numeric keypad is that of selecting an audiovisual channel identified by a number with at least two figures (more commonly called "digit"). This operation is often laborious since during this time, the screen is often black, not knowing which channel the receiver has to be tuned to. The operation consists in successively entering the most significant digits (hundred, ten) first and ending with the units.

In order to inform the remote control signal receiver that the user has finished entering the digits composing the number, and so that the program can recognize this set, a first way of doing so consists in pressing another key, generally called the "Enter" key. The user thereby ends the digits entered. But this first end of acquisition signal has the drawback of obliging the user to press an additional key.

A second end of acquisition signal consists in activating a time delay following a key press, i.e. immediately after the signal containing the code of the pressed key is received by the device. If the time delay reaches a specified value, it is assumed that the user has finished entering the number and therefore the set of previously entered digits forms the number. The maximum duration of the time delay is two seconds for example. But this method has the drawback of extending the time for entering a number, an audiovisual channel for example, and accordingly the screen does not change during this time and the user may wonder whether the pressed keys have actually been recognized.

The European patent application EP 352 446 discloses a program selection device in appliances equipped with a remote control. The program whose character corresponds to the first key pressed is selected immediately, then a time delay is activated during which the device recognizes the next possible characters so as to concatenate them to obtain the complete program identifier. But if the program identifier is coded over more than one character, this method initially selects a program that is not wanted by the user.

The purpose of the present invention is to correct the drawbacks of prior art by simplifying the operations of the user for entering a number comprising several digits and by speeding up the validation of the number entered.

The object of the present invention is a method of validating a number comprising a plurality of digits, the number having a maximum value, comprising a plurality of stages of entering a digit, characterized in that it comprises:

a first stage of validating (3.11) the set of digits entered when:

the number of digits entered is equal to that of the maximum value (MAX) minus a unit, and the most significant digit (MSB) entered is greater than the most significant digit of the maximum value (MAX).

Thus, the method validates the digits entered without waiting for a time delay. In addition, the method does not need to validate the digits entered by entering a special key.

According to a first development, the number entered is also validated when the number entered is less than or equal to the maximum value (MAX), particularly in the case where the digit number entered is equal to that of the digit number of the maximum value. Thus, in any event the validation module checks that the validated number is actually less than or equal to the maximum value. Another development consists in the user being able to quickly validate the digits entered with the aid of a control key. Another development consists in transmitting an audio or visual signal when validating the number.

According to another development, if the number of digits entered is equal to that of the maximum value (MAX) minus a unit, and if the most significant digit (MSB) entered is equal to the most significant digit of the maximum value (MAX), then the number set entered is validated if the second digit entered is greater than the second most significant digit of the maximum value (MAX).

The object of the invention is also an electronic device comprising means of receiving a plurality of signals associated with a digit for forming a number and means of storing a maximum value in memory respectively, characterized in that it comprises a first means of validating the set of digits entered when the number of digits entered is equal to that of the maximum value minus a unit, and when the most significant digit entered is greater than the most significant digit of the maximum value.

According to one development, the device comprises a means of comparison between the number entered and the maximum value that is activated when the test stage is not performed. This means of comparison validates the number entered on condition that it is less than or equal to the maximum value. According to another development, the remote control has a key for ending acquisition of the digits entered and thus shortening the acquisition of the number. According to a particular embodiment, the device is a remote control receiving a signal representing the maximum value and sending to at least one device a signal containing the number thus validated. According to a development of this embodiment, the remote control comprises a touch screen displaying a numeric keypad.

According to one development, the device comprises a third means of validating the number entered when the number of digits entered is equal to that of the maximum value minus a unit, when the most significant digit entered is equal to the most significant digit of the maximum value, and when the second digit entered is greater than the second most significant digit of the maximum value. The test continues to a lower ranking digit as long as the higher ranking digits are equal.

Figure 2:
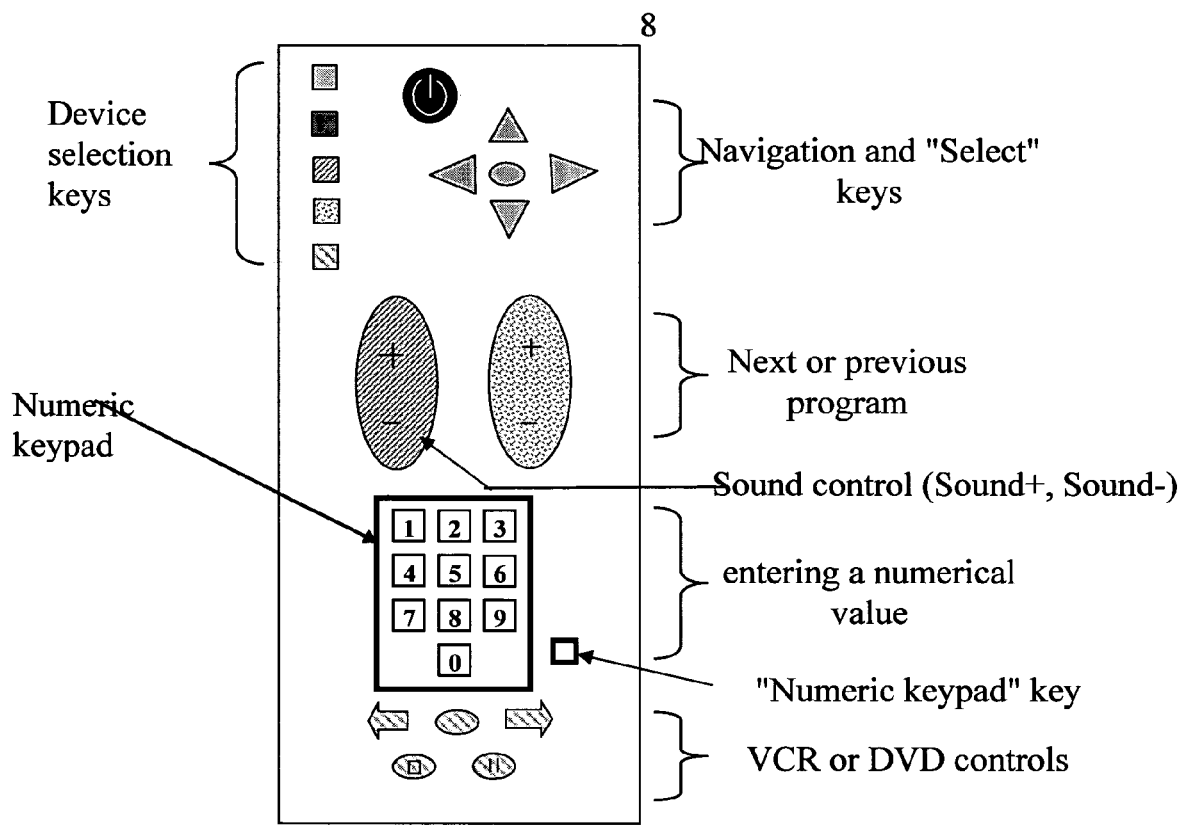
Figure 3:
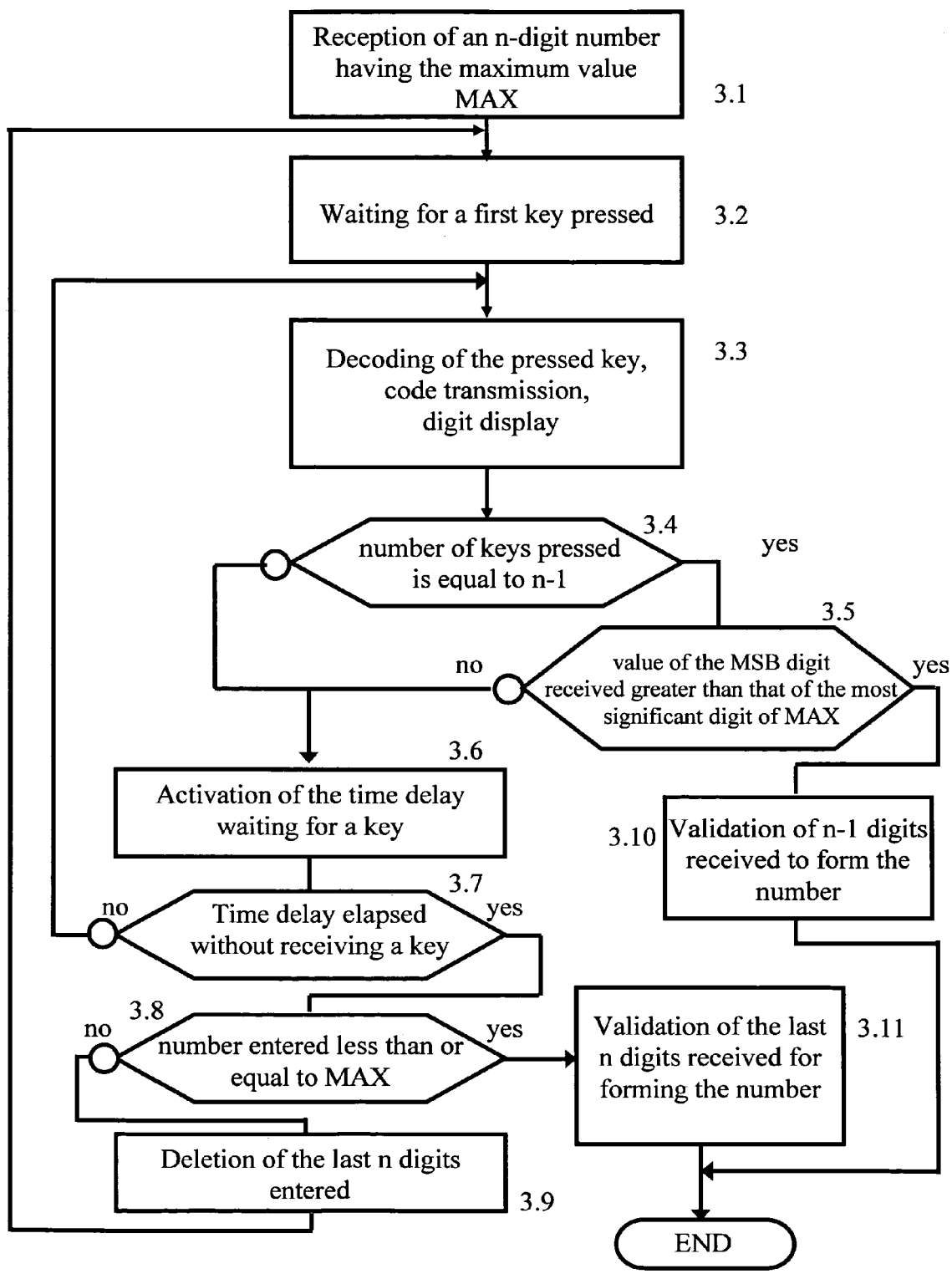

Other characteristics and advantages of the invention will now appear in greater detail within the framework of the following disclosure of examples of embodiment given by way of illustration with reference to the attached figures depicting:

FIG. 1 is a block diagram of an audiovisual receiver for implementing the invention, FIG. 2 depicts a remote control unit according to an example of embodiment of the invention, FIG. 3 is a flow diagram depicting the main stages for implementing an example of embodiment of the invention.

To simplify the disclosure, the same references will be used to designate the elements fulfilling identical functions.

First of all, with the aid of FIG. 1, the operation of an audiovisual receiver 1 equipped with a display device 2 will be disclosed. The receiver comprises a central processing unit 3 connected to a program memory 12 (ROM) and a working memory (RAM), and an interface 5 for communicating with a high speed local digital bus 6 for transmitting audio/video data in real time. This network is an IEEE 1394 network for example. This digital bus also enables data to be sent to a server. The receiver may also receive audio/video data from a broadcasting network via a receiving antenna associated with a demodulator 4. The receiver further comprises an infrared signal receiver 7 for receiving signals from a remote control 8, a means of memory storage 9 for storing audiovisual content, and audio/video decoding logic 10 for generating audiovisual signals sent to the television screen 2. The ROM part of the memory 12 includes the operating system of the receiver 1, the infrared signal receiver 7 management program, and a module 13 for validating the number formed from the signals received from the remote control.

According to an example of embodiment shown in FIG. 2, the remote control 8 is equipped with:

selection keys for devices requiring a numerical value to operate, for example: a television receiver, a video cassette recorder, a decoder, etc., sound adjustment and program selection keys, function keys and in particular a key marked "numeric keypad", navigation keys such as the direction keys ↑, ↓, → and ←, "OK" and "Select" keys, a numeric keypad comprising ten keys marked 0 to 9.

According to a variant embodiment, the remote control is equipped with a touch screen on which symbols corresponding to functions appear. Pressing on the "numeric keypad" symbol displays a set of ten keys on the screen. The user enters a number by pressing on the areas of the screen associated with digits.

The remote control contains a battery that powers a dedicated microprocessor and a light-emitting diode. The microprocessor contains a processor known in itself, as well as necessary ROM and RAM memories, and includes a modulator that delivers pulses (intended for the diode) whose duration and number are programmable. In this way, the remote control 8 sends a series of coded infrared signals Si characteristic of the key pressed. These signals are decoded by the interface 7, 9 which then transmits the code of the key pressed to the central processing unit 3. The control signal Si (i corresponding to the number of control signals transmitted to the receiver) originating from the remote control destined for the receiver, comprises a control message of a type known in itself. It comprises a field containing a numerical value from 0 to 9, containing the numerical value selected by the user by pressing the corresponding key. Furthermore, it may begin with a field containing a start bit "one", a field for identifying the device previously selected by the user and which the control has to control (video cassette recorder, television set, decoder, disk player and/or recorder, etc.).

After revealing the different elements enabling the implementation of an example of a control module, we are now going to disclose in detail how these elements cooperate.

After switching on his receiver, the user wishes to select a channel or a service identified by a three-digit number. He activates an Electronic Program Guide (abbreviated to EPG) which shows him the list of channels available and he can navigate in the guide using direction keys. The user can select a service by moving the pointer on the list or more directly, enter the number of this service. In the second case, he presses the "numeric keypad" key which activates the number validation module. The module waits to receive signals sent by the remote control when the user presses a numeric keypad key. The validation module processes the numerical data contained in the infrared signals to form a numerical value by concatenating the different digits. At the same time, the EPG activates a window for acquiring the service number on the screen. Where necessary, the EPG also displays the largest available channel number value, "699" for example. If the user enters a "7", "8" or "9", as the first digit, this cannot be considered as the hundreds digit and therefore the service number includes two digits at most. Accordingly, once the second digit is entered, the validation module assumes that the two digits form the number and validates it.

After receiving each signal containing a digit's code, the validation module activates a time delay. If the time delay reaches a specified value, typically two seconds, the digits received are validated. At each reception, the time delay is reinitialized to 0 seconds. The acquisition window displays the value of the digits transmitted. As a variant, these digits are displayed on a secondary screen on the front of the receiver, typically an electroluminescent display. If the number of digits transmitted exceeds the display capacity, the first digit disappears to the left, the last digit is positioned the farthest right. As each new digit is entered, the previous digits shift to the left.

The flow diagram in FIG. 3 illustrates the progress of the operations performed by the number validation module. At stage 3.1, the module is activated with the maximum value MAX as the input parameter of the number to be validated. This means that the module will not validate a number greater than MAX. The number MAX comprises n digits. At stage 3.2, the module waits for the user to press a first key on the numeric keypad. The user presses a key which is decoded by the dedicated remote control's microprocessor. A code corresponding to the digit entered is generated and transmitted in an infrared signal to the device which displays it on its screen or any display (stage 3.3). Then at stage 3.4, the module compares the number of digits transmitted by the remote control with the n number of digits of the maximum value. If the number of digits entered is equal to the number of digits of the maximum value (MAX) minus a unit, then the module skips to stage 3.6. Otherwise, at stage 3.5 the module compares the first digit entered (which is the most significant— "MSB" in English terminology) and the most significant digit of the maximum value (MAX). If the first digit entered is greater than the most significant digit of the maximum value, then all the digits have been received, because if another digit is typed in, the resulting number of the digits entered would be greater than the maximum value. The module skips to stage 3.10 of validating the number. The validated number is the concatenation of the n-1 digits entered and the module's execution ends with the validated value as the output parameter.

If the number of digits entered is not equal to the number (n-1) of digits of the maximum value (MAX) minus a unit (stage 3.4 test), or if the most significant digit entered is smaller or equal to the most significant digit of the maximum value (stage 3.5 test), then the module skips to stage 3.6. At stage 3.6, the module activates a time delay and at stage 3.7, it waits to receive a key during said time delay. The time delay is 2 seconds for example. If, during these two seconds, a digit is entered, the module loops back to stage 3.3 of decoding the key, transmission to the device and display. If, on the other hand, the time delay ends without a digit being entered, then the module skips to stage 3.8 to check whether the number entered is actually less than the maximum value. Let us take an example: the maximum value is "650", the user may enter "670" and wait for the end of the time delay, the module should not validate such a number since it is greater than the maximum value. In this case, the module skips to stage 3.9 for deleting the digits entered, and loops back to stage 3.2 of waiting for the first digit entered. If at stage 3.8, it is verified that the number entered is less than the maximum value, then the module assumes that the user has finished entering his digits and accordingly the number is validated. The module then skips to stage 3.11 of validation, the number thus entered is the concatenation of the last n digits entered.

The user may enter a number of digits greater than n by looping through stages 3.3, 3.4, 3.6 and 3.7. But the display and validation only accept the last n digits received, the first digits entered being lost.

According to one development, the receiver sends an audio or visual signal when the number is validated (stage 3.10 or 3.11).

A variant consists in the remote control being equipped with a small display to show the user the number being entered. In this case, the number validation module is located in the remote control. The infrared link between the remote control and the audiovisual receiver is bidirectional. According to the last user command to the device 1, entering a channel number for example, the latter sends an infrared signal to the remote control, containing the maximum value to be entered. This value is accepted by the remote control's validation module as described in the flow diagram of FIG. 3. When the validation module validates the number entered (stage 3.10 or 3.11), the remote control sends an infrared signal containing the validated number. The signal also contains an identifier of the device requiring a numerical value to function. This device is generally the one that has sent the maximum value to the remote control, it may also be that selected by the user with the aid of the device selection keys. Advantageously, the remote control display sends a graphical signal indicating that the number is validated and sent to the device, for example the number displayed flashes on and off three times.

According to one development, when the number to be entered contains n-2 (or less) digits than that of the maximum value, the user may shorten the time delay by pressing the "select" key. For example, the maximum value is "650" and the user wishes to enter "6", he presses the "6" key then the "Select" key, and the validation module will assume that the value "6" is acquired.

According to one development, if the value of the first digit entered is equal to the value of the first digit of the maximum value (MAX), then the module will compare the values of the following digits. When the number of digits entered is equal to (n-1), i.e. the number of digits of the maximum value (MAX) minus a unit, and if the value of the second digit entered is greater than the value of the second digit of the maximum value, then the number entered is validated. The number equality test continues if a certain number of most significant digits are equal. For example, let us assume that the maximum number is 5000. If the user enters a "5", the number to be entered may have four digits. If the user then enters a "0", the number to be entered may still have four digits. But, if the user then enters the digit "1", then the number is automatically validated since entering a fourth digit would make the number entered exceed the maximum number (MAX).

Of course, the invention is not restricted to the embodiment disclosed in the present application. It has been seen that the number entered corresponds to a service number, but it may also correspond to a frequency value, or to an audiovisual content identifier recorded in the memory 9. Likewise, the invention is not limited to entering a number with three digits, but with one or any digits. Finally, the device may be any electronic device requiring a numerical value to be entered for its operation.

The invention claimed is:

1. A method of validating a number comprising a plurality of digits, the number having a maximum value, comprising a plurality of stages of entering a digit, wherein it comprises:
   a first stage of validating the set of digits entered when:
      the number of digits entered is equal to that of the maximum value minus a unit, and
      the most significant digit entered is greater than the most significant digit of the maximum value.

2. The method of validating a number as claimed in claim 1, wherein it further comprises:
   a second stage of validating the number entered when the number entered is less than or equal to the maximum value following an end of acquisition signal.

3. The method of validating a number as claimed in claim 1, wherein it further comprises a stage of entering a command by the user indicating the end of acquisition of the set of digits entered.

4. The method of validating a number as claimed in the claims 1, wherein when the number of digits entered is equal to that of the maximum value (MAX) minus a unit, and when the most significant digit entered is equal to the most significant digit of the maximum value, then the method includes a third stage of validating the set of digits entered if the second digit entered is greater than the second most significant digit of the maximum value, the test continuing to a lower ranking digit as long as the higher ranking digits are equal.

5. The method of validating a number as claimed in the claim 1, wherein it comprises a stage of sending an audio or visual signal when validating the number.

6. An electronic device comprising means of receiving a plurality of signals associated with a digit for forming a number and means of storing a maximum value in memory respectively, wherein it comprises a first means of validating the set of digits entered, this means of validating being activated when both the number of digits entered is equal to that of the maximum value minus a unit, and the most significant digit entered is greater than the most significant digit of the maximum value.

7. The electronic device as claimed in claim 6; wherein it comprises a second means of validating the number entered, this second means of validating being activated when the number entered is less than or equal to the maximum value.

8. The electronic device as claimed in claim 6; wherein it comprises a means of receiving an end of acquisition signal of the number received.

9. The electronic device as claimed in the claim 6, wherein it comprises a third means of validating the number entered when the three following events arises together:
   the number of digits entered is equal to that of the maximum value minus a unit,
   the most significant digit (MSB) entered is equal to the most significant digit of the maximum value,
   and the second digit entered is greater than the second most significant digit of the maximum value, the comparison continuing to a lower ranking digit as long as the higher ranking digits are equal.

10. The electronic device as claimed in the claim 6, wherein it is a remote control further comprising a means of receiving a signal representing the maximum value and a means of sending a signal containing the validated number.

11. The electronic device as claimed in claim 10, wherein the means of reception comprise a touch screen displaying a numeric keypad.

* * * * *